(12) United States Patent
Locati et al.

(10) Patent No.: US 6,300,194 B1
(45) Date of Patent: Oct. 9, 2001

(54) METHOD FOR MANUFACTURING SEMICONDUCTOR INTEGRATED ELECTRONIC MEMORY DEVICES HAVING A VIRTUAL GROUND CELLS MATRIX

(75) Inventors: Vanda Locati, Bergamo; Gianluigi Noris Chiorda, Milan; Luca Besana, Sulbiate, all of (IT)

(73) Assignee: STMicroelectronics S.r.l., Agrte Brianza (IT)

( * ) Notice: Subject to any disclaimer, the term of this patent is extended or adjusted under 35 U.S.C. 154(b) by 0 days.

(21) Appl. No.: 09/473,898

(22) Filed: Dec. 28, 1999

(30) Foreign Application Priority Data

Dec. 29, 1998 (EP) .................................................. 98830795

(51) Int. Cl.⁷ ............................................... H01L 21/8247
(52) U.S. Cl. ...................... 438/257; 438/682; 438/683; 438/587; 438/588
(58) Field of Search .................................. 438/238, 257, 438/262, 582, 583, 587–588, 592–594, 682–683

(56) References Cited

U.S. PATENT DOCUMENTS 5,087,584 * 2/1992 Wada et al. ........................... 438/262
5,340,768 * 8/1994 Gill ....................................... 438/454
5,470,772 11/1995 Woo ....................................... 437/43
5,683,941 11/1997 Kao et al. ............................. 437/200

FOREIGN PATENT DOCUMENTS 0 386 631 A2   9/1990   (EP) .
0 811 983 A1   12/1997  (EP) .
WO 96/08840   3/1996   (WO) .

* cited by examiner

Primary Examiner—Richard Elms
Assistant Examiner—Beth E. Owens
(74) Attorney, Agent, or Firm—Theodore E. Galanthay; Robert Iannucci; Seed IP Law Group PLLC

(57) ABSTRACT

Presented is a process for manufacturing virtual ground electronic memory devices integrated in a semiconductor having a conductivity of a first type and having at least one matrix of floating gate memory cells. In the matrix there are a number of continuous bit lines extending across the substrate as discrete parallel strips, and a number of word lines extending in a transverse direction to the bit lines. The method begins by forming gate regions of the memory cells to produce a number of continuous strips seperated by parallel openings. Then, a dopant is implanted to form, within the parallel openings, the bit lines with conductivity of a second type. Spacers are formed on sidewalls of the gate regions. Then a first layer of a transition metal is deposited into said parallel openings, and the transition metal layer is subjected to a thermal treatment for reacting it with semiconductor substrate and forming a silicide layer over the bit lines.

14 Claims, 2 Drawing Sheets

METHOD FOR MANUFACTURING SEMICONDUCTOR INTEGRATED ELECTRONIC MEMORY DEVICES HAVING A VIRTUAL GROUND CELLS MATRIX

TECHNICAL FIELD

This invention relates to a method for manufacturing electronic memory devices integrated in a semiconductor having a virtual ground cells matrix.

BACKGROUND OF THE INVENTION

EPROM and Flash EPROM electronic memory devices integrated in a semiconductor include a number of non-volatile memory cells organized into a matrix; that is, the cells are arranged into rows, or word lines, and columns, or bit lines. Each non-volatile memory cell includes a MOS transistor with a floating gate electrode located above the channel region, i.e., shows a high d.c. impedance to all the other terminals of a cell and to the circuit in which the cell is incorporated.

The cell also includes a second electrode, known as the control gate, which is driven by suitable control voltages. The other electrodes of the transistor are conventional drain, source, and body terminals.

In recent years, considerable effort has been made to provide memory devices of higher circuit density. This has resulted in the development of electrically programmable non-volatile memory matrices of the contactless type, having a so-called "tablecloth" or crosspoint structure. One example of a matrix of this kind, and its fabrication process, is described in European Patent No. 0 573 728 to this Applicant, and is herein incorporated by reference.

In this class of matrices, the memory cells have source/drain regions formed in the substrate by continuous parallel diffusion strips, known as the bit lines, which are substantially coincident with the matrix columns.

A contactless matrix requires virtual ground circuitry for the reading and programming operations. However, the savings in circuit area afforded by such a structure is remarkable, allowing approximately of one order of magnitude higher number of contacts to be provided.

In this type of virtual ground matrix, parallel strips are defined of a which include a layer of gate oxide, a first layer of polysilicon, an interpoly dielectric layer, and a capping polysilicon layer known as the Poly Cap. These strips form the gate electrodes of the memory cells.

In openings between the various gate electrodes, an implantation, e.g., of arsenic where the substrate is of the P type, is performed to provide the source and drain region diffusion (bit lines).

At this stage of the process the gate electrodes, which are located between previously exposed bit lines, are sealed to permit the implanting steps. An oxidation step allows the dopant to diffuse under the gate electrodes.

This technique causes an increased resistance of the bit lines as the cell size decreases, particularly to less than 0.4–0.5 $\mu$m. The resistance of implanted regions, such as the bit lines, is inversely proportional to the square of the width of those regions.

In addition, where the cell size is made exceedingly small, the length of the channel region becomes quite difficult to control. The actual length of the channel region of a MOS transistor is known to depend on: the size of the gate electrode, itself dependent on photolithography and etching operations on the polysilicon layers; implantations in the channel region controlling the cell performance in terms of threshold voltage and current; and the lateral diffusion of the implanted source/drain regions due by the thermal treatments to which the semiconductor is subjected after the implantation step.

SUMMARY OF THE INVENTION

Embodiments of the invention provide an improved process for manufacturing electronic memory devices integrated in a semiconductor having a virtual ground cells matrix, whereby the memory cells exhibit fairly low surface resistances and a longer channel than in prior art devices.

Therefore, embodiments of the invention provide memory cells of a reduced size whose implanted regions, such as the bit lines of the virtual ground memory cells, are salicided and formed by implantation at a low dopant concentration, thereby affording improved control of the cell channel region length.

Presented is a process for manufacturing virtual ground electronic memory devices integrated in a semiconductor of a first type and having at least one matrix of floating gate memory cells. In the matrix there are a number of continuous bit lines extending across the substrate as discrete parallel strips, and a number of word lines extending in a transverse direction to the bit lines. The method begins by forming gate regions of the memory cells to produce a number of continuous strips separated by parallel openings. Then, a dopant is implanted in to form, within the parallel openings, the bit lines with conductivity of a second type. Spacers are formed on sidewalls of the gate regions. Then a first layer of a transition metal is deposited into the parallel openings, and the transition metal layer is subjected to a thermal treatment for reacting it with the semiconductor substrate and forming a silicide layer over the bit lines.

The features and advantages of a method according to the invention will be apparent from the following description of an embodiment thereof, given by way of non-limitative example with reference to the accompanying drawings.

DETAILED DESCRIPTION

Figure 1:
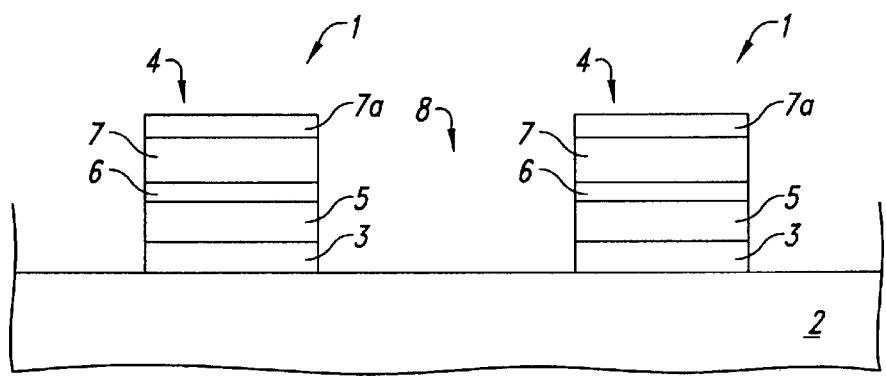
FIGS. 1 to 5 are vertical cross-sectional drawings views of a portion of a semiconductor substrate going through a salicidation process in accordance with an embodiment of the invention.

An improved method is described, with reference to the drawings, for manufacturing virtual ground electronic memory devices 1 integrated on a semiconductor substrate 2. The invention can be realized in combination with integrated circuit fabrication techniques currently employed in the industry, and only such commonly used process steps as are necessary for an understanding of this invention will be discussed. Discussion of structures or processes well known to those skilled in the art has been abbreviated or eliminated for brevity. The drawings are not drawn to scale, but rather for highlighting important features of the invention.

A layer 3 of gate oxide is formed over a semiconductor substrate 2 having a P type conductivity. The next step is to form the gate electrodes 4 of the memory devices 1.

The formation of the gate electrodes 4 of non-volatile memory cells 1 includes a multiple deposition step, as required to provide a stack structure which consists of: a first layer 5 of polysilicon (also known as the POLY1), an intermediate dielectric layer 6 and a second layer 7 of polysilicon (POLY CAP), and an upper dielectric layer 7a.

By a conventional photolithography step, the stack structure is etched away in cascade to provide the gate electrodes 4, in the following order: the upper dielectric layer 7a, the second polysilicon layer 7, the intermediate dielectric layer 6, the first polysilicon layer 5, and the gate oxide layer 3.

The cell matrix will presently appear as formed of a plurality of continuous strips separated by openings or grooves 8.

Advantageously, at this stage of the process the cell may be subjected to an oxidation step.

An ion implantation step using arsenic, as necessary for imparting electrical conductivity of the N type, will serve to define bit lines 9 through the openings 8 provided in the stack structure.

Spacers 10 are then formed on the sidewalls of the gate electrodes 4.

Figure 2:
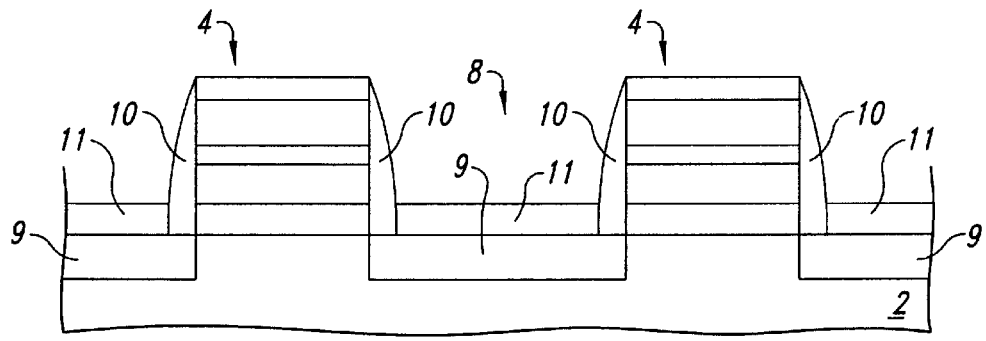

At this point, the method includes the deposition of a layer 11 of a transition metal into the parallel openings 8, as shown in FIG. 2. The transition metal may be titanium, for example. However, another metal, e.g., cobalt, could be used instead. In a preferred embodiment a second layer, of titanium nitride, is also deposited into the parallel openings 8.

The semiconductor 2 is subjected to a thermal treatment for reacting the titanium layer 11 to form a titanium silicide layer 12.

Figure 3:
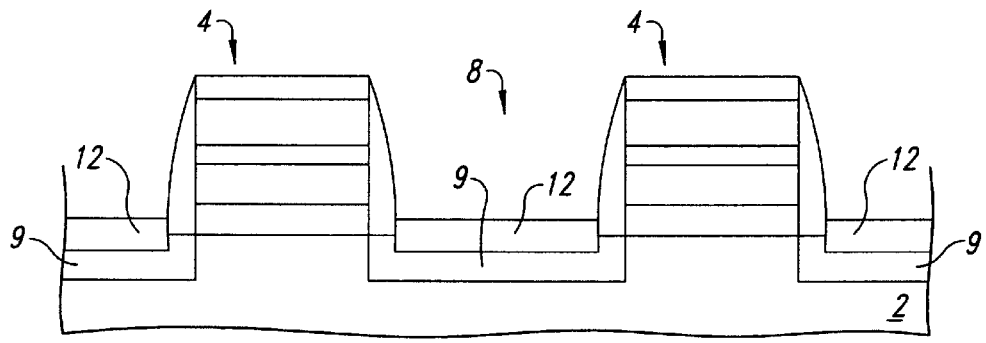

According to this embodiment of the invention, once the bit lines 9 have been salicided, lower implant dosages can be used during the implantation step for forming the bit lines 9 than if the bitlines 9 had not been salicided. Using a lower implant dosage provides better control over the length of the cell channel region, which would be included between two adjacent bit lines 9. In this context, the term salicidation is used to indicate a process step whereby a self-aligned silicide layer is formed. (FIG. 3)

The process further includes the deposition of an intermediary dielectric layer 13 into the matrix grooves 8, in order to planarize the surface of the semiconductor substrate by filling the gaps 8 between the bit lines 9.

Figure 4:
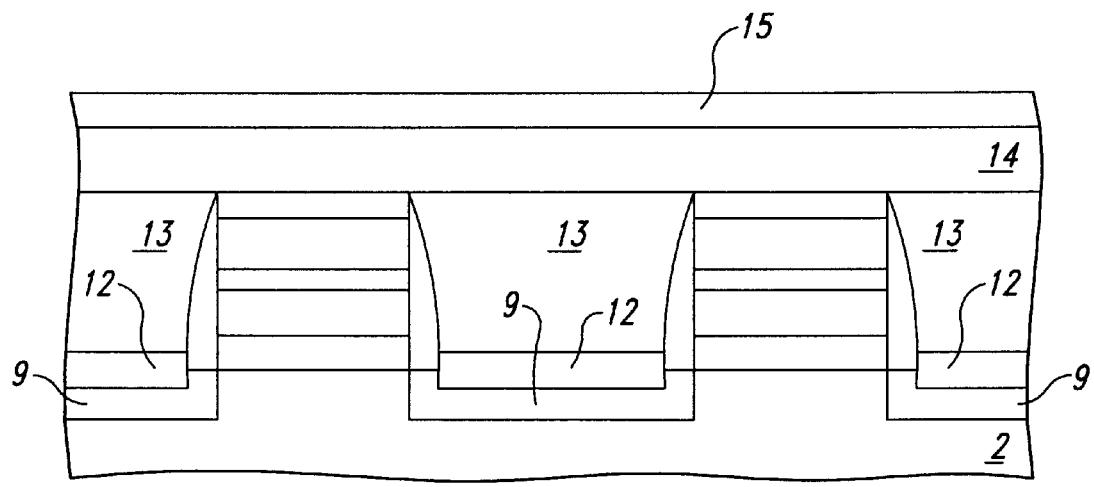

At this step of the method according, a step of planarizing the dielectric layer 13 is carried out to expose the Poly Cap surface, also removing the upper dielectric layer 7a as shown in FIG. 4.

A multiple deposition is then carried out which includes a conducting layer 14. e.g., of polysilicon, and a second layer 15 of transition metal.

Figure 5:
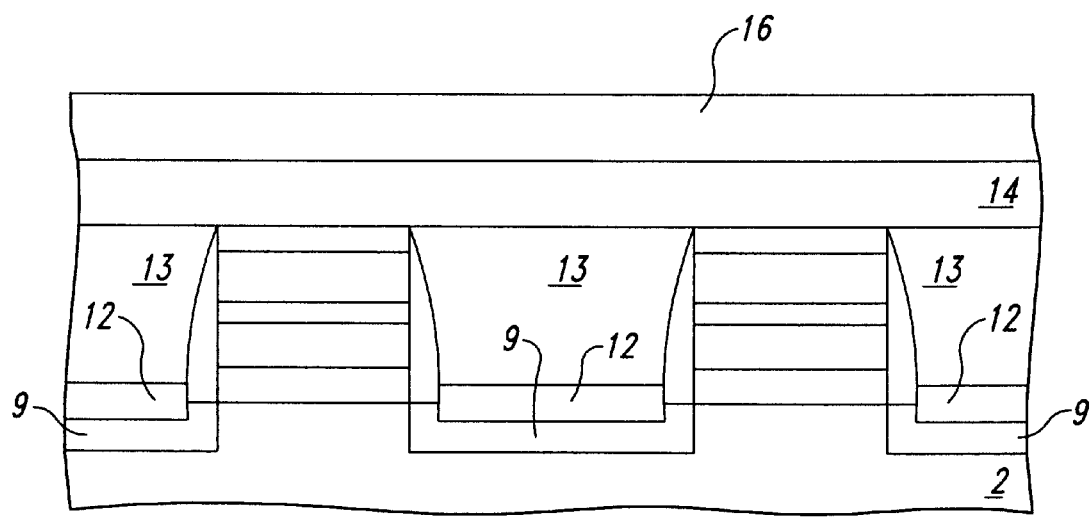

The semiconductor is subjected to a thermal treatment for reacting the transition metal layer 15 to form a silicide layer 16. (FIG. 5)

The polysilicon 15 and silicide 16 layers are then patterned conventionally to define word lines of the matrix which will lie in a transverse direction to the bit lines 9.

Advantageously in this invention this second transition metal layer 15 is titanium, i.e., the same material as the first transition metal layer 11. In this way, annealing at high temperatures, as required by the tungsten silicide technology used for forming the final layer in prior art devices, and apt to damage the silicide layer on the bit lines, can be avoided.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method for manufacturing virtual ground electronic memory devices integrated in a semiconductor having at least one matrix of floating gate memory cells, the matrix of cells being formed in a semiconductor substrate having conductivity of a first type, with a plurality of continuous bit lines extending across the semiconductor substrate as discrete parallel strips, and with a plurality of word lines extending in a transverse direction to the bit lines, the method comprising:

forming gate regions of the memory cells to produce a plurality of continuous strips separated by parallel openings;

implanting a dopant to form, within said parallel openings, said bit lines with conductivity of a second type;

forming spacers on sidewalls of the gate regions;

depositing a first layer of a transition metal into said parallel openings and in contact with said bit lines; and subjecting said transition metal layer to a thermal treatment for reacting it with the semiconductor substrate and forming a silicide layer over said bit lines.

2. The method according to claim 1, further comprising:

filling the parallel openings with a dielectric layer;

planarizing the dielectric layer overlying the bit lines;

depositing a conducting layer onto the planarized semiconductor;

depositing a second layer of a transition metal onto the conducting layer; and subjecting the second layer of a transition metal to a thermal treatment for reacting it with the conducting layer to form a second silicide layer wherein the word lines of the matrix will be formed.

3. The method according to claim 1, wherein depositing a first layer of a transition metal into said parallel openings comprises depositing a titanium metal layer.

4. The method according to claim 2, wherein depositing a second layer of a transition metal onto the conducting layer comprises depositing titanium.

5. The method according to claim 1, wherein implanting a dopant within said parallel openings comprises implanting a low-concentration dose of implant.

6. A method to form memory devices having a virtual ground comprising:

depositing a gate oxide layer on a semiconductor substrate having a first conductivity type;

depositing a first polysilicon layer on the gate oxide layer;

depositing an interpoly dielectric layer on the first polysilicon layer;

depositing a second polysilicon layer on the interpoly dielectric layer;

etching the second polysilicon layer, the interpoly dielectric layer, the first polysilicon layer, and the gate oxide layer to form at least a first and a second stacked gate structures having an area between them;

doping the area between the first and the second stacked gate structures with a dopant to form a bit line;

forming spacers at sidewalls of the first and second stacked gate structures;

depositing a layer of a transition metal onto the area between the first and the second stacked gate structures and in contact with the bit line; and heating the semiconductor substrate to form a silicide layer from the transition metal.

7. The method of claim 6, further comprising:

filling the area between the first and the second stacked gate structures with an intermediary dielectric layer;

planarizing the intermediary dielectric layer;

depositing a second layer of a transition metal over the planarized intermediary dielectric layer; and heating the semiconductor substrate to form a second silicide layer from the second layer of transition metal.

8. The method according to claim 6, wherein depositing a layer of a transition metal onto the area between the first and the second stacked gate structures comprises depositing a titanium metal layer.

9. The method according to claim 7, wherein depositing a second layer of a transition metal over the planarized intermediary dielectric layer comprises depositing titanium.

10. The method according to claim 6, wherein doping the area between the first and the second stacked gate structures forms a bit-line.

11. A memory structure comprising a plurality of memory cells, the memory structure formed by the steps of:

forming a plurality of gate structures comprising a gate oxide layer, a first polysilicon layer, an interpoly dielectric layer, and a second polysilicon layer;

doping an area between a first and a second of the plurality of gate structures with a dopant to form a bit line;

depositing a layer of a transition metal onto the area between the first and the second gate structures and in direct contact with the bit line; and heating the semiconductor substrate to form a silicide layer from the transition metal.

12. The memory structure of claim 11, further formed by the steps of:

filling the area between the first and the second gate structures with an intermediary dielectric layer;

planarizing the intermediary dielectric layer;

depositing a second layer of a transition metal over the planarized intermediary dielectric layer; and heating the semiconductor substrate to form a silicide layer from the second layer of transition metal.

13. The memory structure of claim 11, wherein depositing a layer of a transition metal onto the area between the first and the second stacked gate structures comprises depositing a titanium metal layer.

14. The memory structure of claim 12, wherein depositing a second layer of a transition metal over the planarized intermediary dielectric layer comprises depositing titanium.

\* \* \* \* \*